United States Patent [19]

Thorén

[11] Patent Number: 5,543,704
[45] Date of Patent: Aug. 6, 1996

[54] PULSE WIDTH MODULATED DC-TO-DC BOOST CONVERTER

[75] Inventor: Hans C. Thorén, Stockholm, Sweden

[73] Assignee: Telefonaktiebolaget LM Ericsson, Stockholm, Sweden

[21] Appl. No.: 255,380

[22] Filed: Jun. 8, 1994

[51] Int. Cl.⁶ .................................................. G05F 1/613
[52] U.S. Cl. ............................................ 323/222; 323/282
[58] Field of Search ............................ 323/222, 259, 323/235, 282, 319, 351; 363/16, 20, 21, 101

[56] References Cited

U.S. PATENT DOCUMENTS

| | | | |
|---|---|---|---|
| 4,184,197 | 1/1980 | Cuk et al. | 363/16 |
| 4,654,769 | 3/1987 | Middlebrook | 363/16 |
| 4,720,668 | 1/1988 | Lee et al. | 323/271 |
| 4,736,286 | 4/1988 | Gulczynski | 363/70 |
| 4,841,220 | 6/1989 | Tabisz et al. | 323/282 |
| 4,903,182 | 2/1990 | Pilukaitis et al. | 363/19 |
| 4,940,929 | 7/1990 | Williams | 323/222 |
| 4,959,764 | 9/1990 | Bassett | 363/16 |
| 4,977,493 | 12/1990 | Smith | 363/126 |
| 5,180,964 | 1/1993 | Ewing | 323/222 |
| 5,307,005 | 4/1994 | Ahladas et al. | 323/222 |
| 5,313,382 | 5/1994 | Farrington | 363/16 |
| 5,418,704 | 5/1995 | Hua et al. | 363/21 |
| 5,434,767 | 7/1995 | Batarsch et al. | 363/16 |

FOREIGN PATENT DOCUMENTS

0496718A2  1/1992  European Pat. Off. .
0649214A2  10/1994  European Pat. Off. .
WO94/09554  4/1994  WIPO .

OTHER PUBLICATIONS

Buchanan, E. E and Miller, E. J., "Resonant Switching Power Conversion Technique", IEEE Power Electronics Specialists Conference, PESC '75 Record, 188–193 (Jun. 1975).

Miller, E. J., "Resonant Switching Power Conversion", IEEE Power Electronics Specialists Conference, PESC '76 Record, 206–211 (Jun. 1976).

Kassakian, J. G. and Schlecht, M. F., "High–Frequency High–Density Converters for Distributed Power Supply Systems", Proceedings of the IEEE, vol. 76, No. 4, 362–376 (Apr. 1988).

Lee, F. C., "High–Frequency Quasi–Resonant Converter Technologies", Proceedings of the IEEE, vol. 76, No. 4, 377–390 (Apr. 1988).

Primary Examiner—Peter S. Wong
Assistant Examiner—Adolf Berhane
Attorney, Agent, or Firm—Jenkens & Gilchrist, PC

[57] ABSTRACT

A pulse width modulated DC-to-DC boost converter circuit in which switching losses are minimized. The circuit operates at a constant frequency and in continuous mode (at a constant current). Turn-on losses are minimized by causing the parasitic intrinsic capacitance of the main switching device to be discharged before the switching device is switched to the conducting state, and reducing reverse recovery current from the output rectifier of the circuit when the output rectifier turns off. Turn-off losses in the switching device are minimized by causing a condition of zero volts across the switching device at turn-off.

16 Claims, 5 Drawing Sheets

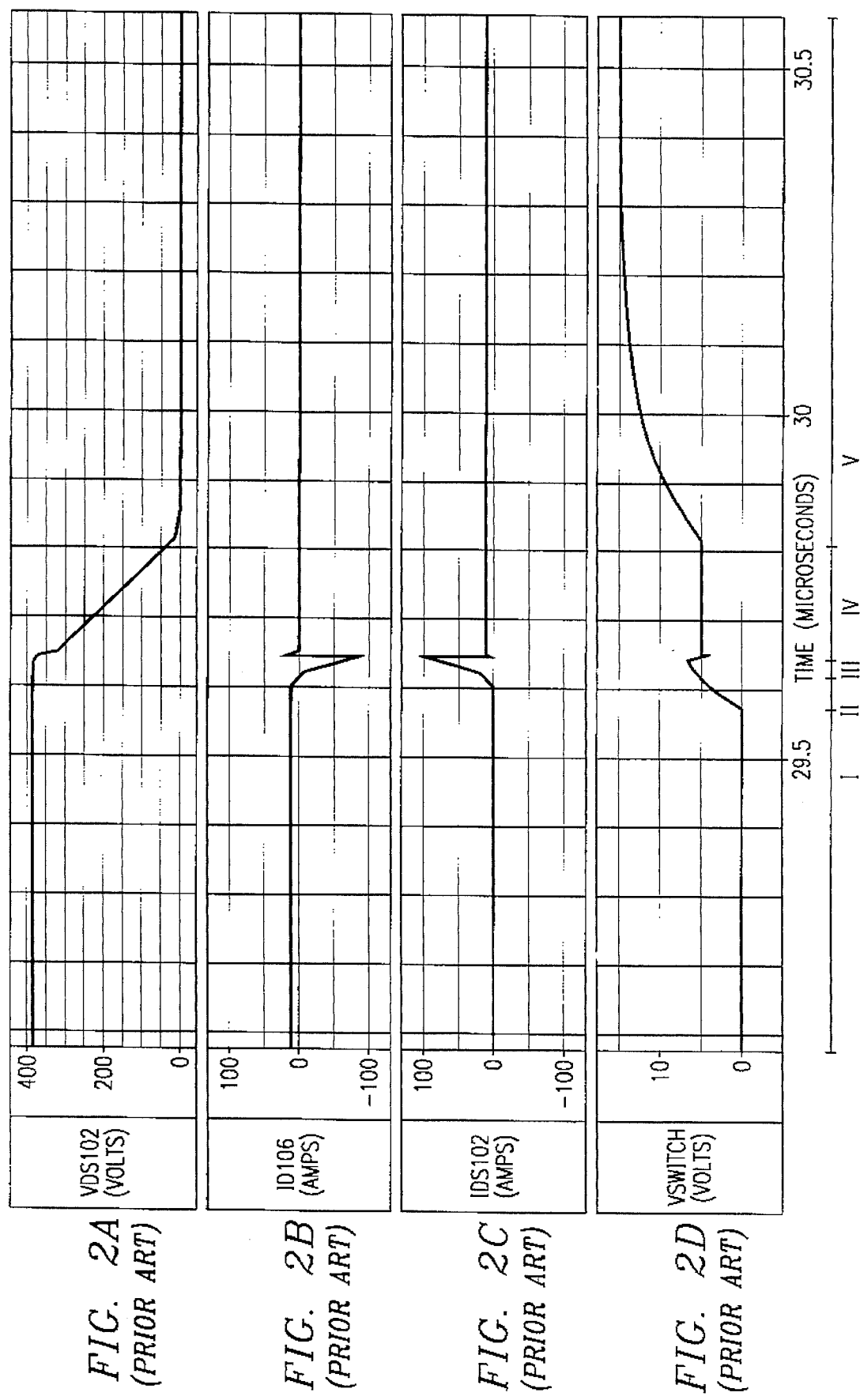

PULSE WIDTH MODULATED DC-TO-DC BOOST CONVERTER

BACKGROUND OF THE INVENTION

This invention relates to DC-to-DC voltage converters and, more particularly, to DC-to-DC boost converters which minimize switching losses in converter semiconductor devices by using zero voltage switching techniques.

A DC-to-DC boost converter is usually chosen as the front end power stage in an AC/DC converter. DC-to-DC converters can be of two types: pulse width modulated (PWM) converters and resonant converters. PWM converters interrupt power flow and control the duty cycle to process power. Resonant converters process power in sinusoidal form. PWM converters operate at a constant frequency and variable pulse width, while resonant converters operate with variable frequency at a constant pulse width. PWM converters are used predominantly today because of circuit simplicity and ease of control.

In a PWM boost converter circuit a switch is rapidly switched on to create a high voltage across an inductor. When the switch is turned off, the inductor current charges an output capacitor through a diode and creates a voltage at the output higher than the original supply voltage. FIG. 1 illustrates a basic (PWM) boost converter circuit 100 comprised of a MOSFET power transistor (MOSFET) 102, inductor 104, diode 106 and a capacitor 108. The gate terminal "g" of the MOSFET 102 is connected to an external pulsed switching voltage source (Vswitch) 116. The drain terminal "d" of the MOSFET 102 is connected to the inductor 104 and the diode 106. The source terminal "s" of the MOSFET 102 is connected to ground. FIG. 1 shows a voltage source (Vin) 112 to be connected at the input to the circuit 100, and a load 114 connected in parallel to the capacitor 108 at the output of the circuit 100. FIG. 1 also shows reference currents IL104 through the inductor 104, ID106 through the diode 106, and IDS102 through the MOSFET 102; and reference voltages VL104 across inductor 104, VDS102 across MOSFET 102, VC108 across capacitor 108, and VL across the load 114.

MOSFET 102 functions as an electronic switch to control the current IL104 through the inductor 104. During the converter switching cycle a pulsed voltage is applied to the gate of the MOSFET 102 by Vswitch 116. This pulsed voltage cycles the MOSFET 102 from the "on" (conducting) to the "off" (nonconducting) state. When MOSFET 102 is on and conducting, the drain-source voltage VDS102 across MOSFET 102 is zero and the current IL104 is driven from Vin through inductor 104 and MOSFET 102 to ground. The currents IL104 in inductor 104 and IDS102 in MOSFET (102) are equal at this time. During this stage of the switching cycle VL is supplied to the load by voltage VC108 on capacitor 108 which was charged in the previous cycle. Diode 106 blocks reverse current flow from the capacitor 108 into MOSFET 102 and ground.

When MOSFET 102 is switched off, the interruption in the flow of current IDS102 through MOSFET 102 creates a higher voltage across the inductor 104. At switch off, the voltage VL104 across inductor 104 instantaneously changes polarity and rises to the difference between Vin and VL. The Diode 106 is now forward biased and the energy stored in inductor 104 is discharged into capacitor 108 and the load 114 by the current ID106 through diode 106. The current through inductor 104 decreases and the voltage VC108 on capacitor 108 increases.

The previous cycle of switching MOSFET 102 on and off is repeated. After a set time MOSFET 102 is again turned on. The converter is automatically controlled so that the average current in inductor 104 equals the load current. Current is again driven from Vin to ground through inductor 104 and MOSFET 102, while capacitor 108 supplies the load 114 with charged energy stored during the previous cycle. The average voltage on capacitor 108 depends on the pulse-width of the output of Vswitch 116. The cycle of switching MOSFET 102 between on and off is repeated at a very high rate. The pulsed voltage applied by Vswitch 116 can be typically at a frequency of 30–50 kHz. A high converter switching frequency is desirable because higher frequencies allow the use of inductors smaller in both value and size. The converter can then be packaged in a smaller volume and will be lighter in weight.

One drawback of operating a converter at high switching frequencies, however, is the switching power losses which increase as the switching frequency increases. In practice, these switching losses are the limiting factor for the choice of switching frequency. One goal of converter design has been to operate at high frequencies while minimizing switching losses in the switching elements of the converter.

In the boost circuit 100 of FIG. 1 losses occur both during turn-on and turn-off of MOSFET 102. A MOSFET, such as MOSFET 102, has an internal parasitic capacitance which is effectively a capacitance across the drain-source terminals. This drain-source capacitance causes MOSFET 102 to inductively turn off and capacitively turn on. During turn-off, voltage spikes induced by the leakage inductances cause noise and voltage stress. During turn on, the energy stored in MOSFET 102's drain-source capacitance is dissipated internally. The turn-on loss depends on the switching frequency and the energy stored in the drain-source capacitance.

Another cause of switching losses in the boost circuit 100 are turn-on losses in the switching transistor MOSFET 102 due to reverse recovery current in the diode 106 before diode 106 turns off. When MOSFET 102 is turned on there is a finite time required for recombination of charges in diode 106. Until these charges in diode 106 recombine, a negative spike of reverse recovery current is generated in diode 106. The energy from this current spike is dissipated in MOSFET 102.

The turn-on switching losses from the MOSFET 102 drain-source capacitance and the diode 106 reverse recovery current are shown in FIGS. 2A–D which illustrate current and voltage waveforms for the MOSFET 102 turn-on portion of the switching cycle. FIG. 2A shows VDS102, the drain-source voltage on MOSFET 102. FIG. 2B shows ID106, the current through diode 106. FIG. 2C shows IDS102, the drain-source current through MOSFET 102. FIG. 2D shows Vswitch, the applied gate-source voltage on MOSFET 102. As may be seen from FIGS. 2A–D, the MOSFET 102 turn on portion of the switching cycle may be divided into five ti me interval s I–V.

During interval I, Vswitch is zero and MOSFET 102 is off. VDS102 is at the output voltage level plus the voltage drop across diode 106. At the beginning of interval II, Vswitch begins to rise as it is pulsed high to turn MOSFET 102 on. During Interval II Vswitch is below the threshold voltage needed to turn MOSFET 102 on. During interval III MOSFET 102 turns on as Vswitch rises above the turn-on threshold. VDS102 decrease by as the drain-source capacitance of MOSFET 102 discharges, and diode 106 becomes reverse biased and begins to turn off. The current ID106 goes negative because of the large pulse of reverse recovery current in diode 106. Since there is no limiting resistor in series with MOSFET 102 and diode 106, the current ID106 is relatively large. Because the voltage VDS102 is still high, large power losses occur in MOSFET 102. In interval IV diode 106 has turned off. More losses occur in MOSFET 102 as VDS102 collapses to zero. In interval V, Vswitch rises and MOSFET 102 becomes saturated and fully turned on.

The losses in MOSFET 102 during intervals III and IV of the turn on cycle can be limited by minimizing the voltage VDS102 across MOSFET 102 and the reverse recovery current ID106 in diode 106, which flows into MOSFET 102 during the turn-on portion of the switching cycle. The ideal turn on condition would be to set VDS102 across MOSFET 102 at zero volts. With VDS102 at zero volts during turn on, the product of voltage times the current in MOSFET 102 and, therefore the power dissipation, would be zero. This goal can be realized by applying known zero voltage switching techniques to the basic boost converter circuit of FIG. 1.

Zero voltage switching is a technique whereby the drain-source capacitance of MOSFET 102 is caused to discharge in a quasi-sine wave fashion so that the device can be switched at the instant the voltage across it is at zero. Traditionally, zero voltage switching techniques have been used to transform in PWM converters into hybrids of PWM and resonant converters. These hybrids are known as quasi-resonant converters. While these quasi-resonant converters minimize switching power losses, they do not operate as true PWM converters. In a quasi-resonant converter the voltage across the switching device can be up to twice the output voltage. Thus, Quasi-resonant converters require a switching device which can withstand a voltage over twice the output voltage in contrast to PWM converters which require a switching device which can withstand just the output voltage. Quasi-resonant converts also operate at a variable frequency. It would be desirable, however, to have a PWM boost converter which operates at a constant frequency, in continuous mode (at a constant current), and which has minimal switching losses.

The present invention provides a PWM converter design allowing for zero voltage switching at turn-on and minimal switching losses. This PWM boost converter design operates as a true PWM converter. Furthermore, it can be operated at higher frequencies and is smaller in size and weight. Also, because it operates at a constant frequency, simpler input and output filters may be used with the converter circuit of the present invention.

SUMMARY OF THE INVENTION

In one aspect, the present invention provides a boost converter circuit which includes a first inductive means for receiving forward current supplied to an input terminal of the circuit and a first electronic switch coupled to the first inductive means. The first electronic switch, which has an intrinsic parasitic capacitance, is cyclically switched between a conducting state in which forward current flows from the first inductive means through the first electronic switch, and a non-conducting state in which forward current flows from the first inductive means to an output terminal of the circuit. The circuit also includes a first capacitive means coupled to the output terminal and a first rectifying means coupled between the first inductive means and the first capacitive means. The first capacitive means provides an output voltage and is charged when the first electronic switch is in the non-conducting state. The first rectifying means passes forward current to the first capacitive means when the first electronic switch is in the non-conducting state, and blocks the flow of reverse current from the first capacitive means when the switch is in the conducting state.

The circuit of the present invention further includes means for discharging the parasitic capacitance of the first electronic switch comprising a second inductive means coupled between the first inductive means and the first rectifying means, and a second electronic switch coupled to the second inductive means. The second electronic switch is cyclically switched to a conducting state when the first electronic switch is in the nonconducting state for causing forward current to be diverted from the first rectifying means to the second inductive means. The parasitic capacitance is then discharged by current flowing from the first electronic switch to the second inductive means. The second inductive means operates to limit the flow of forward current from the first inductive means, and the flow of reverse recovery current from the first rectifying means, when the second electronic switch becomes conducting.

In another aspect, the present invention provides a method to be applied in a boost converter circuit which includes a first inductive element and a first electronic switch for controlling the flow of forward current from the first inductive element to a first rectifying element. The first switch, which has a parasitic capacitance, is cyclically turned on and off to control the flow of forward current to the first rectifying element. The method of the present invention allows for the discharging of the parasitic capacitance of the first switch, while minimizing turn-on losses in the first switch and losses caused by reverse recovery current from the first rectifying element. The method includes the step of directing the flow of forward current from the first inductive element, and the flow of reverse recovery current from the rectifying element, to a second inductive element to allow for the discharge of the parasitic capacitance when the first switch is turned off. The method also includes the step of directing the flow of the current from the second inductive element to a second rectifying element when the first switch is turned on. A second electronic switch is turned on to direct the forward current from the first inductive element, and the reverse recovery current from the rectifying element, to the second inductive element, and turned off to direct the current from the second inductive element to the second rectifying element.

BRIEF DESCRIPTION OF THE DRAWINGS

For a more detailed understanding of the present invention, for further objects and advantages thereof, reference can now be had to the following description, taken in conjunction with the accompanying drawings in which:

FIGS. 2A–D show voltage and current waveforms which illustrate turn-on power losses for the circuit of FIG. 1;

DETAILED DESCRIPTION

Figure 1:
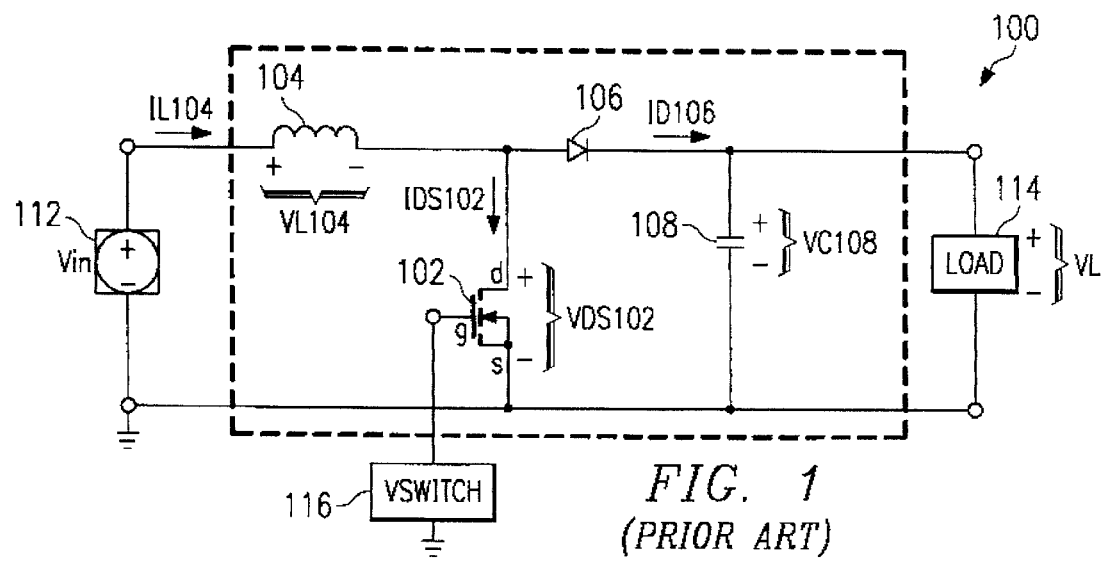
FIG. 1 is a schematic circuit diagram of a prior art boost converter circuit.
Figure 3:
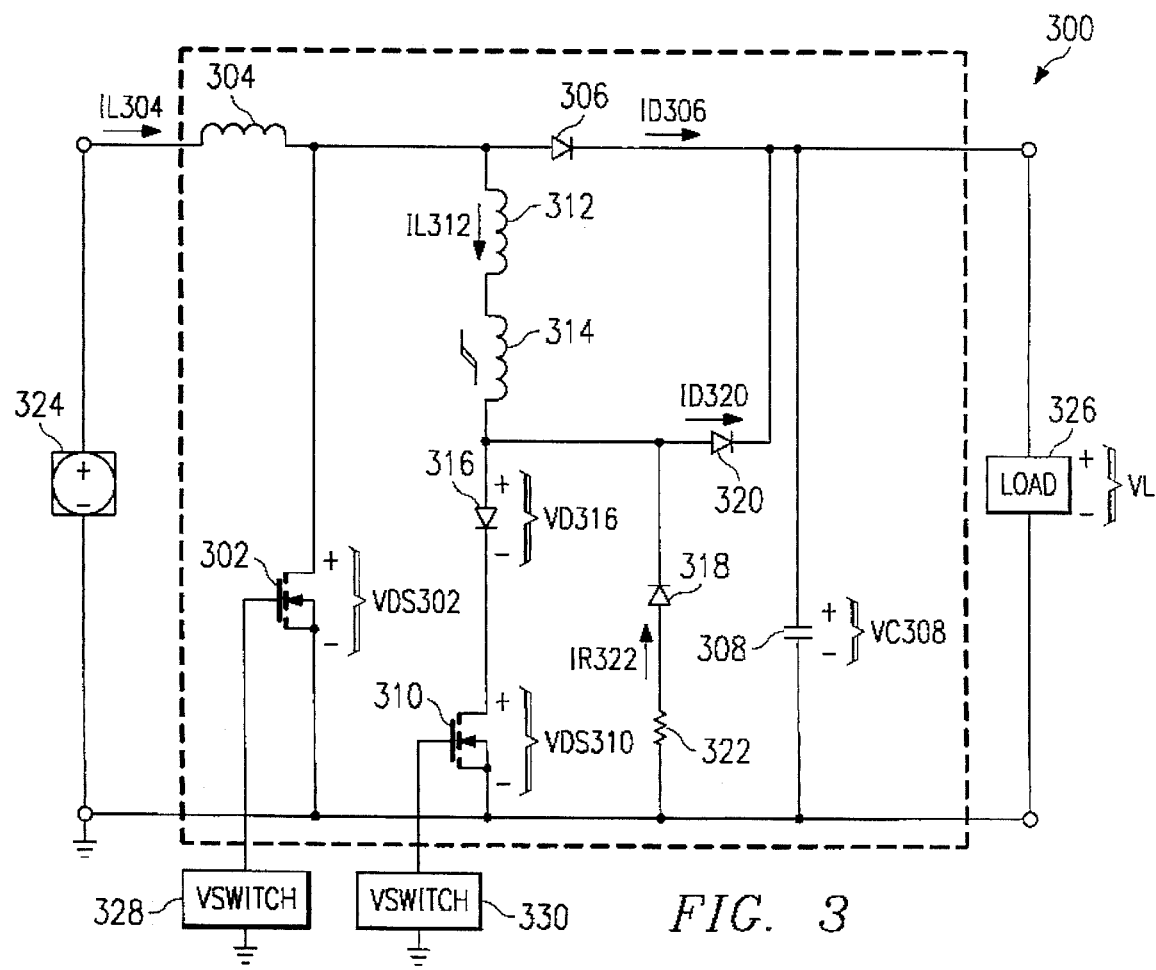
FIG. 3 is a schematic circuit diagram of a first boost converter circuit incorporating the teachings of the present invention.

Referring first to FIG. 3, there is shown a first exemplary embodiment of a boost converter circuit 300 constructed in accordance with the teachings of the present invention. The circuit 300 comprises a MOSFET power transistor (MOSFET) 302, inductor 304, diode 306, capacitor 308, MOSFET power transistor (MOSFET) 310, inductor 312, saturable inductor 314, diode 316, diode 318, diode 320, and a resistor 322. A voltage source (Vin) 324 is connected at the inputs of the circuit 300 and a load 326 is connected at the outputs of the circuit 300. The gate of MOSFET 302 is connected to a pulsed switching voltage source (Vswitch) 328 and the gate of MOSFET 310 is connected to an auxiliary switching voltage source (Vswitch) 330. Vswitch 328 applies a pulsed voltage to the gate of MOSFET 302 to turn MOSFET 302 on and off. Vswitch 330 applies a pulsed voltage to the gate of MOSFET 310 to turn MOSFET 310 on and off. FIG. 3 also shows reference currents IL304 through inductor 304, ID306 through diode 306, IL312 through inductor 312, ID320 through diode 320, IR322 through resistor 322; and reference voltages VDS302 across the drain-source of MOSFET 302, VDS310 across the drain-source of MOSFET 310, VC308 across capacitor 308, VD316 across diode 316 and VL across the load 326.

In operation, the circuit 300 functions as a conventional boost converter while at the same time minimizing losses caused by reverse recovery current in diode 306 and turn-on losses in MOSFET 302. The circuit 300 is also designed so that losses from reverse recovery current in the diode 320 and turn-on losses in the MOSFET 310 are minimal.

The circuit 300 uses a resonant switching technique whereby MOSFET 302's drain-source capacitance discharges in a resonant mode through MOSFET 310 before MOSFET 302 is turned on. MOSFET 302 is then switched on when VDS302 is equal to zero. Resonant switching is used only in the MOSFET 302 turn-on stage of the switching cycle. The turn-on losses in MOSFET 310 are minimized by using inductor 314 to limit the current rise in MOSFET 310 at turn-on.

Figure 4A:
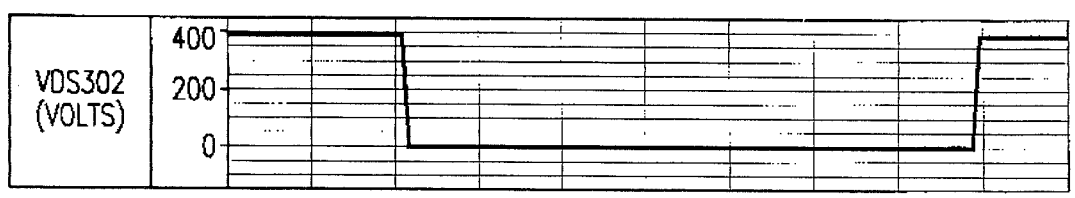
FIGS. 4A–F show voltage and current waveforms which illustrate the switching cycle of the circuit of FIG. 3.
Figure 4B:
Figure 4C:
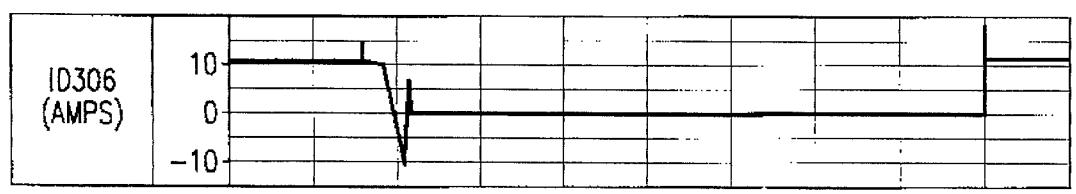
Figure 4D:
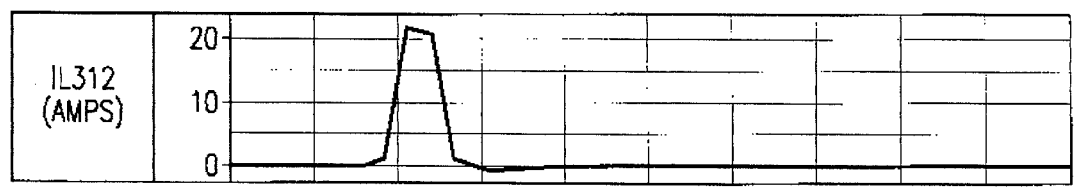
Figure 4E:
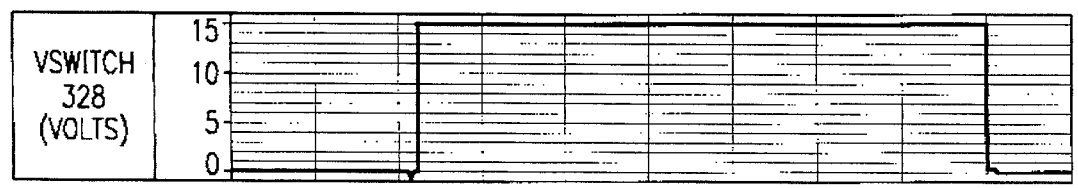
Figure 4F:
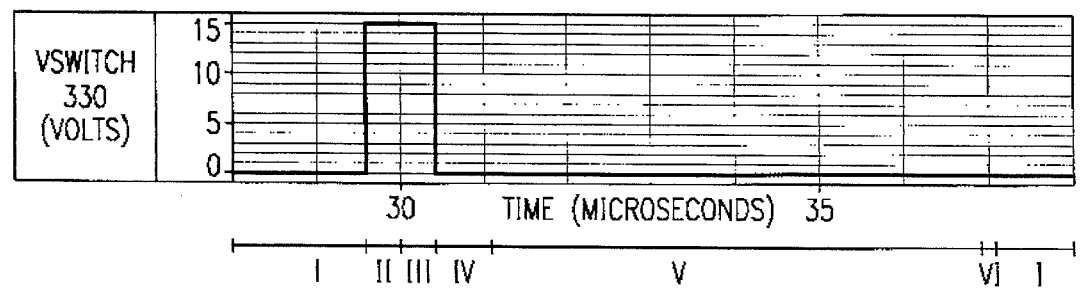

The operation of circuit 300 can be better understood by reference to the switching cycle waveforms shown in FIGS. 4A–F. FIG. 4A shows VDS302, the drain-source voltage on MOSFET 302. FIG. 4B shows VDS310+VD316, the combined drain-source voltage on MOSFET 310 and auxiliary diode 316. FIG. 4C shows ID306, the current through diode 306. FIG. 4D shows IL312, the current through auxiliary inductor 312. FIG. 4E shows Vswitch 328, the voltage applied to the gate of MOSFET 302. FIG. 4F shows Vswitch 330, the voltage applied to the gate of MOSFET 310. In FIGS. 4A–F, the switching cycle for the circuit 300 is shown to be divided into 6 time intervals I–VI.

With reference to FIGS. 3–4, during interval I, Vswitch 328 and Vswitch 330 are both zero, and MOSFET 302 and MOSFET 310 are off. The voltages VDS302 and VDS310+VD316 are at the load voltage plus the voltage drop across diode 306. During this time, the current IL304 in inductor 304 and the current ID306 in diode 306 are equal and flow to the capacitor 308 and the load 326. At the beginning of interval II, Vswitch 330 is pulsed to turn-on MOSFET 310. VDS310+VD316 drops to zero, the current IL312 in inductor 312 rises, and the current ID306 in diode 306 decreases. The inductance of inductor 304 is relatively large, on the order of, for example, 1 mH, and will hold current IL304 constant during MOSFET 310 turn-on. Therefore, as the current IL312 in inductor 312 increases, the current ID306 in diode 306 decreases at the same rate. Saturable inductor 314 initially limits the rise of the current IL312 in inductor 312 which flows through MOSFET 310 to ground. This limits the turn-on losses of MOSFET 310. Eventually, saturable inductor 314 saturates and the rate of increase of the current IL312 in inductor 312 will depend on the value of inductor 312. When the current IL312 in inductor 312 equals the current IL304 through inductor 304, the current ID306 begins to go negative due to the reverse recovery current in diode 306 when diode 306 turns off. The reverse recovery current is limited by the rate of decrease of the current ID306. The rate of decrease of ID306 is determined by the value of inductor 312. This negative spike of ID306 will cause the current IL312 in inductor 312 to rise to a value higher than the current in inductor 304 until diode 306 turns off completely.

Interval III begins when diode 306 turns off. The current IL312 in inductor 312 is now larger than the current through inductor 304. The excess of the value of current IL312 in inductor 312 over the current IL304 through inductor 304 flows from MOSFET 302 through the inductor 312 to keep the current IL312 through inductor 312 constant. This excess current discharges the drain-source capacitance of MOSFET 302. When the drain-source capacitance is discharged, the diode of MOSFET 302 will conduct the excess current. When VDS302 becomes equal to zero, Vswitch 328 is pulsed high to turn-on MOSFET 302. Since the drain-source capacitance is already discharged, turn-on will be free of drain-source capacitance losses.

At the beginning of interval IV, MOSFET 310 is turned off. The current IL312 in inductor 312 commutates over to diode 320 and capacitor 308. The current IL312 in inductor 312 will decrease at a rate which depends upon the output voltage and the value of inductor 312. At the same time the current in MOSFET 302 will increase so that the total current is constant, equal to the current IL304 in inductor 304. When the current IL312 in inductor 312 is close to zero, inductor 314 comes out of saturation and the rate of decrease of IL312 slows further. Because of the reverse recovery current in diode 320, IL312 exhibits a spike of negative current when diode 320 becomes reverse biased and begins to turn off. This reverse recovery current will be limited by inductor 314.

Interval V begins when diode 320 turns off. At this point the negative current ID320 commutates and flows from ground, as current IR322, through resister 322, diode 318 and the inductors 312, 314. Diode 316 prevents current from flowing from ground through the body diode of MOSFET 310 into inductor 312. The current IL312 in inductor 312 now decreases at a rate which depends on the value of the resistor 322. The resistive damping effect of resistor 322 prevents excessive ringing in inductor 312, inductor 314, diode 318 and diode 306. This prevents excessive voltage across diode 316 and diode 320 when diode 320 turns off.

The cycle is completed in interval VI when Vswitch 328 is set to zero to turn MOSFET 302 off. The current in MOSFET 302 is commutated over to diode 306, diode 306 then opens, and the current ID306 in diode 306 increases. The next switching cycle then begins at interval I and proceeds as described above.

Figure 5:
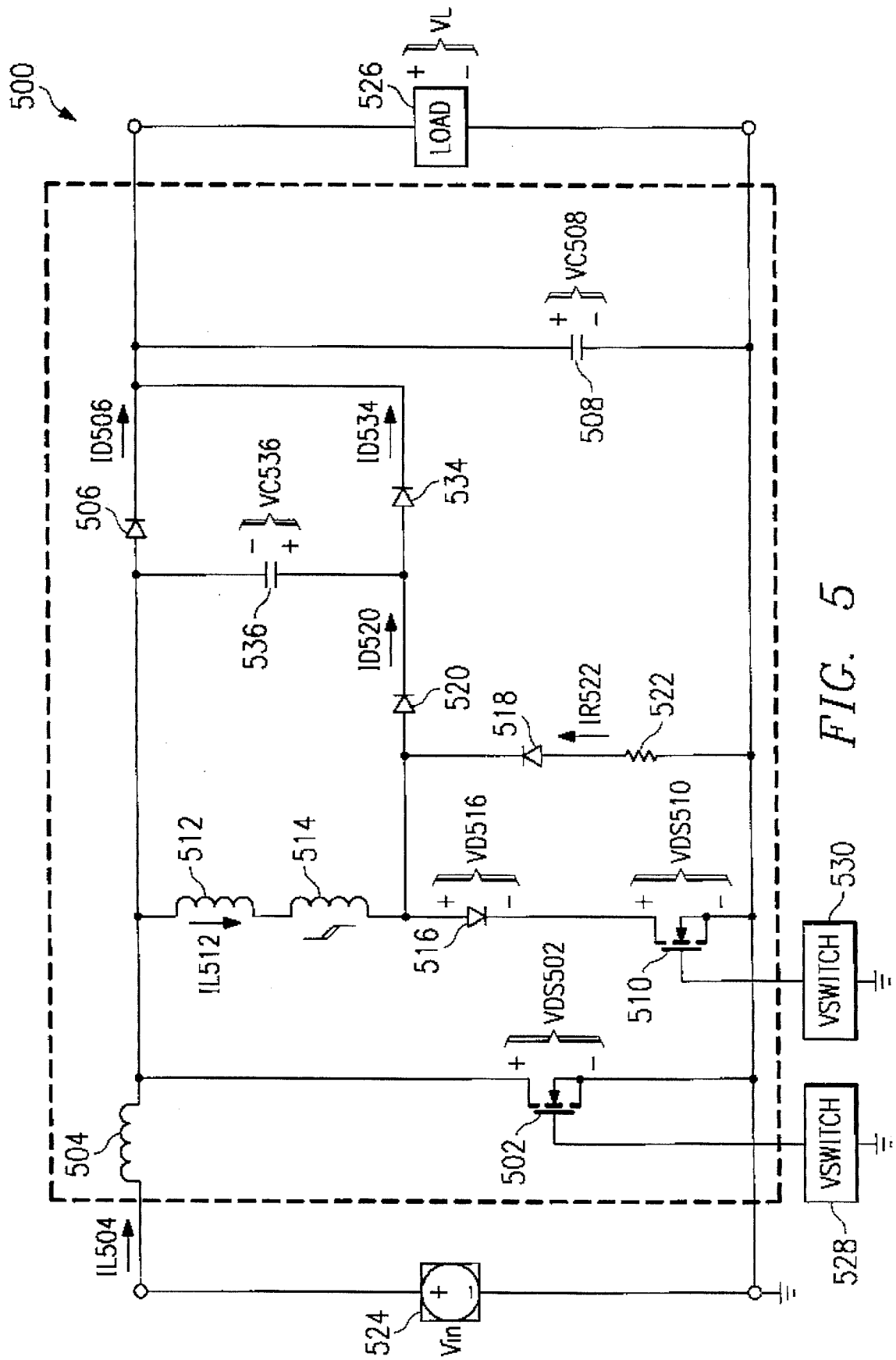
FIG. 5 is a schematic circuit diagram of a second boost converter circuit incorporating the teachings of the present invention.

FIG. 5 shows a second exemplary embodiment of a boost converter circuit 500 constructed in accordance with the present invention. The circuit 500 comprises a MOSFET power transistor (MOSFET) 502, inductor 504, diode 506, capacitor 508, switching MOSFET power transistor (MOSFET) 510, inductor 512, saturable inductor 514, diode 516, diode 518, diode 520, resistor 522, diode 534, and capacitor 536. A voltage source (Vin) 524 is connected to the inputs of the circuit 500 and a load 526 is connected at the outputs of the circuit 500. A pulsed voltage is applied by a Vswitch 528 to the gate of MOSFET 502 to switch MOSFET 502 on and off, and a pulsed voltage is applied by Vswitch 530 to the gate of MOSFET 510 to switch MOSFET 510 on and off.

FIG. 5 also shows reference currents IL504 through inductor 504, ID506 through diode 506, IL512 through inductor 512, ID520 through diode 520, IR522 through resistor 522, and ID534 through diode 534; and reference voltages, VDS502 across the drain-source of MOSFET 502, VC508 across capacitor 508, VDS510 across the drain-source of MOSFET 510, VC536 across capacitor 536, VD516 across diode 516 and VL across the load 526.

In operation, the circuit 500 functions as a conventional boost converter while losses from reverse recovery current in diode 503 and both turn-on and turn-off losses in MOSFET 502 are minimized in accordance with the present invention. The circuit 500 is also designed so that losses from reverse recovery current in diode 520 and both turn-on and turn-off losses in the MOSFET 510 are mini real.

The circuit 500 uses resonant switching techniques whereby MOSFET 502's drain-source capacitance discharges in a resonant mode through MOSFET 510 before MOSFET 502 is turned on. Resonance switching is used only in the MOSFET 502 turn-on stage of the switching cycle. During MOSFET 502 turn-off, the voltage across MOSFET 502 is minimized by using the voltage VC536 across capacitor 536. MOSFET 510 turn-on losses are minimized by using inductor 514 to limit the current flowing through MOSFET 510 at turn-on. MOSFET 510 turn-off losses are minimized by using the voltage VC536 across capacitor 536.

Figure 6A:
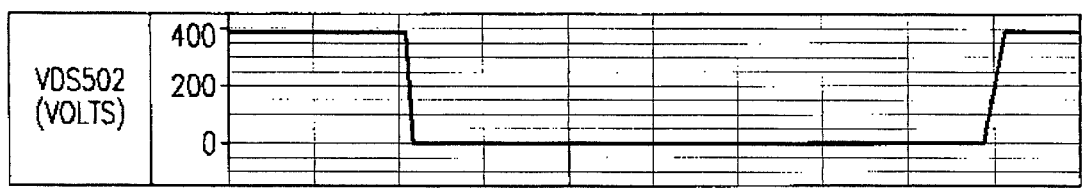
FIGS. 6A–F show voltage and current waveforms which illustrate the switching cycle of the circuit of FIG. 5.
Figure 6B:
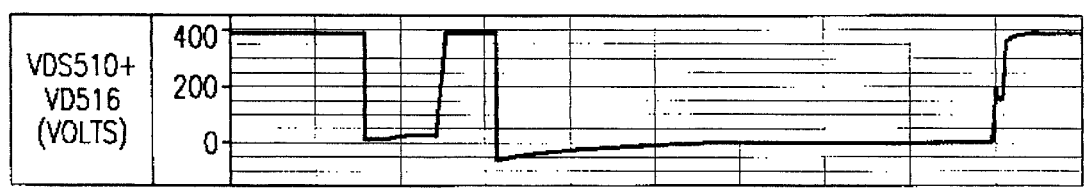
Figure 6C:
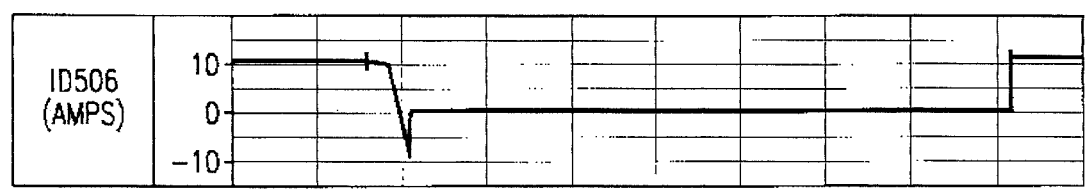
Figure 6D:
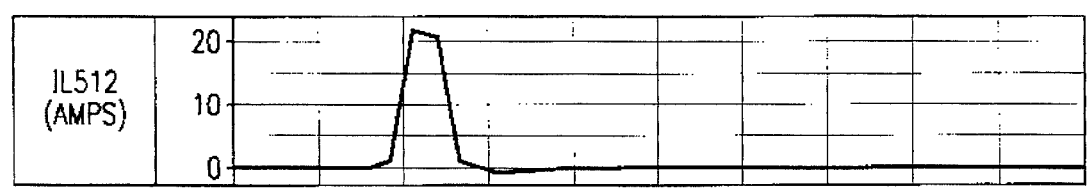
Figure 6E:
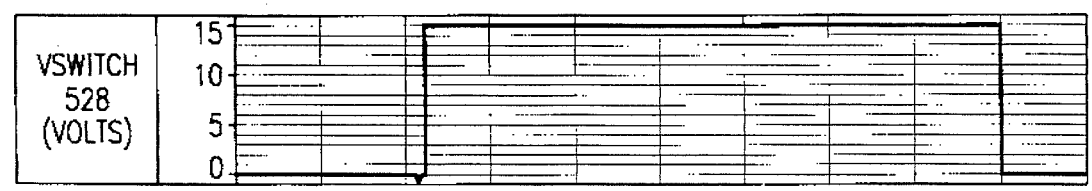
Figure 6F:
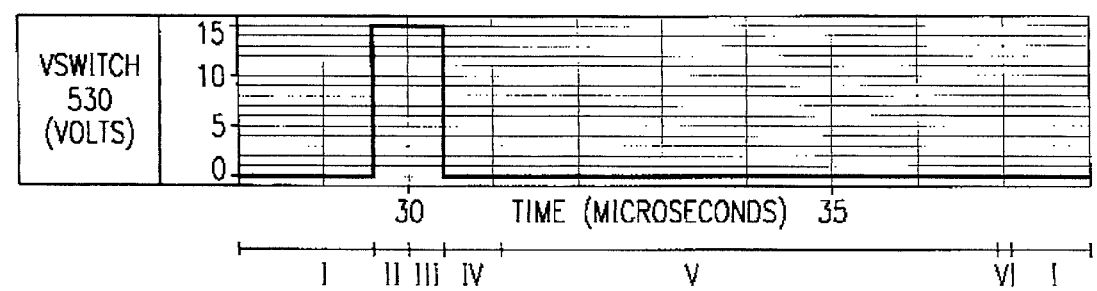

FIG. 6A illustrates the waveforms for VDS502, the drain-source voltage on MOSFET 502. FIG. 6B shows VDS510+ VD516, the combined drain-source voltage on MOSFET 510 and voltage across auxiliary diode 516. FIG. 6C shows ID506, the current through diode 506. FIG. 6D shows IL512, the current through auxiliary inductor 512. FIG. 6E shows Vswitch 528, the voltage applied to the gate of MOSFET 502. FIG. 6F shows Vswitch 530, the voltage applied to the gate of MOSFET 510. The switching cycle for the circuit of FIG. 5 can be divided into 6 time intervals I–VI.

In time intervals I to III components 502–522 in the circuit 500 of FIG. 5 function substantially the same as components 302–322 of FIG. 3, respectively. The operation of the circuit 500 during intervals IV to VI is substantially identical to the corresponding operation of the circuit 300 which was described above, except that the turn-off losses in MOSFETS 502 and 510 are minimized because of voltage conditions on VC536 which exist at times when either MOSFET 502 or MOSFET 510 are turned off. The operation of the circuit 500 during intervals IV–VI is described below.

With reference to FIGS. 5–6, at the beginning of interval IV, Vswitch 530 switches to zero and MOSFET 510 turns off. The current IL512 in inductor 512 now charges capacitor 536 through diode 520. Capacitor 536 is initially discharged and VC536 is zero. While capacitor 536 is charging, the voltage VDS510 across MOSFET 510 equals the voltage VC536 on capacitor 536. Turn-off losses in MOSFET 510 are minimized since VDS510 and VD516 are zero at turn-off. This results in a slower rise of VDS510 and VD516 in interval IV of FIG. 6 as compared to the rise of VDS310 and VD316 in interval IV of FIG. 4. When capacitor 536 charges to the output voltage, the current IL512 in inductor 512 flows as current ID534 into diode 534, and diode 534 becomes forward biased and turns on. The current IL512 in inductor 512 now decreases at a rate which depends on the output voltage VL and the inductance of inductor 512. When the current IL512 in inductor 512 nears zero, inductor 514 comes out of saturation and slows the rate of decrease of IL512 further. Because of the reverse recovery current in diode 520 and diode 534, the current IL512 exhibits a spike of negative current when diode 520 and diode 534 become reverse biased arid begin to turn off. The reverse recovery current will then be limited by inductor 514.

At the beginning of interval V, diode 520 and diode 534 turn-off, and the small negative current IL512 in inductor 512 commutates and flows from ground as current IR522 through resistor 522, diode 518 and the inductors 514, 512 and into MOSFET 502. Diode 516 prevents current from flowing from ground through the body diode of MOSFET 510 into inductor 512. The current IL512 decreases, with the rate of decrease depending on the value of resistor 522. The damping effect of resistor 522 prevents excess voltage over diode 516 and diode 520 when diode 520 turns off. Current now flows through inductor 504 and MOSFET 502, and the voltage VC536 across capacitor 536 equals the output voltage.

At the beginning of interval VI, Vswitch 528 goes to zero and MOSFET 502 is turned off. VDS502 now equals VL minus the voltage VC536 across capacitor 536, and is close to zero. Turn-off losses in MOSFET 502 are therefore minimal. The current IL504 in inductor 504 discharges capacitor 536 to zero through diode 534. This results in a slightly slower rate of rise of VDS502 in interval VI of FIG. 6 as compared to the rate of rise of VDS302 in interval VI of FIG. 4. When capacitor 536 is fully discharged, diode 506 will turn-on and diode 534 will turn off. The switching cycle is now complete.

The following is an exemplary list of typical industry standard components and circuit parameters which may be used to build and operate the boost converter circuits of FIG. 3 and FIG. 5.

| | |
|---|---|
| MOSFET 302, 502 | IRF460 |
| MOSFET 310, 510 | IRF840 |
| Diode 306, 506 | APT30D60B |
| Diode 316, 516 | Philips BYM26C |
| Diode 318, 518 | Philips BYM26C |
| Diode 320, 520 | Philips BYM26C |
| Diode 534 | Philips BYM26C |
| Resistor 322, 522 | 20 ohms |
| Inductor 304, 504 | 1 mH |
| Inductor 312, 512 | 4 uH |
| Inductor 314, 514 | 6 turns on Toshiba SA14×8×4.5 |
| Capacitor 536 | 6.8 nF |
| Capacitor 308, 508 | C = 1 mF (may vary) |
| Vout | 400 volts |
| Vin | 230 volts |
| Switching frequency | 50 kHz |

It will be understood by the practitioner skilled in the art that these component values are presented as examples of typical values and that the circuits of FIG. 3 and FIG. 5 may be implemented with many different component values and circuit parameters. It will also be apparent that various changes can be made in details of construction from those shown in the attached drawings and discussed in conjunction therewith without departing from the spirit and scope of this invention. It is, therefore to be understood that this invention is not to be limited to the specific details shown and described.

What is claimed is:

1. A boost converter circuit comprising:

a first inductive means for receiving forward current supplied to an input terminal of said circuit;

a first electronic switch coupled to said first inductive means, said first electronic switch having a parasitic intrinsic capacitance and being cyclically switched between a conducting state in which forward current flows from said first inductive means through said switch, and a non-conducting state in which forward current flows from said first inductive means to an output terminal of said circuit;

a first capacitive means coupled to said output terminal for providing an output voltage, said capacitive means being charged when said first electronic switch is in the non-conducting state;

a first rectifying means coupled between said first inductive means and said first capacitive means, said first rectifying means passing forward current to said first capacitive means when said first electronic switch is in the non-conducting state, and blocking the flow of reverse current from said capacitive means when said switch is in the conducting state; and means for discharging the parasitic intrinsic capacitance of said first electronic switch comprising:

a second inductive means coupled between said first inductive means and said first rectifying means;

a second electronic switch coupled to said second inductive means, said second electronic switch being cyclically switched to a conducting state when said first electronic switch is in the non-conducting state for causing forward current to be diverted from said first rectifying means to said second inductive means, said parasitic capacitance being discharged by current flowing from said first electronic switch to said second inductive means;

a second rectifying means coupled between said second inductive means and said second electronic switch;

a third rectifying means coupled to said second inductive means and said first rectifying means; and a fourth rectifying means coupled to said second and third rectifying means said fourth rectifying means for directing current from ground to said second inductive means to compensate for the decrease in the reverse recovery current from said second rectifying means when said second electronic switch is turned off.

2. The boost converter circuit of claim 1 wherein said second inductive means operates to limit the flow of forward current from said first inductive means, and the flow of reverse recovery current from said first rectifying means, when said second electronic switch becomes conducting.

3. The boost converter circuit of claim 1 wherein said first inductive means has a larger inductance than said second inductive means.

4. The boost converter circuit of claim 1 wherein said second inductive means comprises a series combination of an inductor and a saturable inductor.

5. The boost converter circuit of claim 1 wherein:

each of said first and second electronic switches comprises a MOSFET power transistor;

each of said first, second, third and fourth rectifying means comprises a diode; and said first capacitive means comprises a capacitor.

6. A boost converter circuit comprising:

a first inductive means for receiving forward current supplied to an output terminal of said circuit;

a first electronic switch coupled to said first inductive means, said first electronic switch having a parasitic intrinsic capacitance and being cyclically switched between a conducting state in which forward current flows from said first inductive means through said switch, and a non-conducting state in which forward current flows from said first inductive means to an output terminal of said circuit;

a first capacitance means coupled to said output terminal for providing an output voltages, said capacitive means being charged when said first electronic switch is in the non-conducting state;

a first rectifying means coupled between said first inductive means and said first capacitive means, said first rectifying means passing forward current to said first capacitive means when said first electronic switch is in the non-conducting state, and blocking the flow of reverse current from said first capacitive means when said switch is in the conducting state;

means for discharging the parasitic intrinsic capacitance of said first electronic switch comprising:

a second inductive means coupled between said first inductive means and said first rectifying means;

a second electronic switch coupled to said second inductive means, said second electronic switch being cyclically switched to a conducting state when said first electronic switch is in the non-conducting state for causing forward current to be diverted from said first rectifying means to said second inductive means, said parasitic capacitance being discharged by current flowing from said first electronic switch to said second inductive means;

a second capacitive means coupled to said second inductive means, said second capacitive means acting to limit the voltage across said first and second electronic switches when each of said electronic switches is turned off;

a second rectifying means coupled between said second inductive means and said second electronic switch;

a third rectifying means coupled between said second inductive means and second capacitive means;

a fourth rectifying means coupled to said second and third rectifying means, said fourth rectifying means directing current from ground to said second inductive means to compensate for the decrease in the reverse recovery current from said second rectifying means when said second electronic switch is turned off; and a fifth rectifying means coupled between said first rectifying means and said second capacitive means.

7. The boost converter circuit of claim 6 wherein:

each of said first and second electronic switches comprises a MOSFET power transistor;

each of said first, second, third, fourth and fifth rectifying means comprises a diode; and each of said first and second capacitive means comprises a capacitor.

8. In a boost converter circuit including a first inductive element, a first electronic switch for controlling the flow of forward current from said first inductive element to a first rectifying element, said first switch having a parasitic capacitance and being cyclically turned on and off, a method for discharging the parasitic capacitance of said first switch, while minimizing turn-on losses in said first switch and losses caused by reverse recovery current from said first rectifying element, said method comprising the steps of:

directing the flow of forward current from said first inductive element, and the flow of reverse recovery current from said first rectifying element, to a second inductive element to allow for the discharge of said parasitic capacitance when said first switch is turned off by turning on a second switch;

directing the flow of current from said second inductive element to a second rectifying element when said first switch is turned on by turning off said second switch; and directing current from ground to said second inductive element through a third rectifying element to compensate for the decrease in the reverse recovery current from said second rectifying element when said second switch is turned off.

9. The method of claim 8 wherein said second inductive element comprises a series combination of an inductor and a saturable inductor.

10. The method of claim 8 wherein said first inductive element has a larger inductance than said second inductive element.

11. The method of claim 8 wherein said second rectifying element is connected to a first capacitive element which acts to limit the voltage across said first and said second electronic switches when each of said electronic switches, respectively, is turned off.

12. The method of claim 11 wherein a fourth rectifying element is connected between said first rectifying element and said first capacitive element.

13. The method of claim 12 wherein said first and third rectifying elements are connected to a second capacitive element at the output of said circuit.

14. A boost converter circuit comprising:

a first inductor having a first terminal and a second terminal, the first terminal connected to an input terminal of said circuit;

a first switch, having a conducting and a nonconducting state, for coupling the second terminal of said first inductor to ground when said first switch is in the conducting state and for disconnecting the second terminal of said first inductor from ground when said first switch is in the nonconducting state;

a first rectifier having a first terminal and a second terminal, the first terminal of said first rectifier connected to the second terminal of said first inductor and the second terminal of said first rectifier connected to an output terminal of said circuit;

a capacitor having a first terminal and a second terminal, the first terminal of said capacitor connected to the output terminal of said circuit and the second terminal of said capacitor connected to ground;

a second inductor having a first terminal and a second terminal, the first terminal of said second inductor connected to the second terminal of said first inductor;

a third inductor having a first terminal and a second terminal, the first terminal of said third inductor connected to the second terminal of said second inductor;

a second rectifier having a first terminal and a second terminal, the first terminal of said second rectifier connected to the second terminal of said third inductor and the second terminal of said second rectifier connected to the output terminal of said circuit;

a third rectifier having a first terminal and a second terminal, the first terminal of said third rectifier connected to the second terminal of said third inductor;

a second switch, having a conducting state and a nonconducting state, for coupling the second terminal of said third rectifier to ground when said second switch is in the conducting state and for disconnecting the second terminal of said third rectifier from ground when said second switch is in the nonconducting state;

a fourth rectifier having a first terminal and a second terminal, the second terminal of said fourth rectifier connected to the first terminal of said third rectifier; and a resistor having a first terminal and a second terminal, the first terminal of said resistor connected to the first terminal of said fourth rectifier and the second terminal of said resistor connected to ground.

15. A boost converter circuit comprising:

a first inductor having a first terminal and a second terminal, the first terminal connected to an input terminal of said circuit;

a first switch having a conducting and a nonconducting state, for coupling the second terminal of said first inductor to ground when said first switch is in the conducting state and for disconnecting the second terminal of said first inductor from ground when said first switch is in the nonconducting state;

a first rectifier having a first terminal and a second terminal, the first terminal of said first rectifier connected to the second terminal of said first inductor and the second terminal of said first rectifier connected to an output terminal of said circuit;

a first capacitor having a first terminal and a second terminal, the first terminal of said capacitor connected to an output terminal of said circuit and the second terminal of said first capacitor connected to ground;

a second inductor having a first terminal and a second terminal, the first terminal of said second inductor connected to the second terminal of said first inductor;

a third inductor having a first terminal and a second terminal, the first terminal of said third inductor connected to the second terminal of said second inductor;

a second rectifier having a first terminal and a second terminal, the first terminal of said second rectifier connected to the second terminal of said third inductor;

a third rectifier having a first terminal and a second terminal, the first terminal of said third rectifier connected to the second terminal of said third inductor;

a second switch, having a conducting and a nonconducting state, for coupling the second terminal of said third rectifier to ground and for disconnecting the second terminal of said third rectifier from ground when said second switch is in the nonconducting state;

a fourth rectifier having a first terminal and a second terminal, the second terminal of said fourth rectifier connected to the first terminal of said second rectifier;

a resistor having a first terminal and a second terminal, the first terminal of said resistor connected to the first terminal of said fourth rectifier and the second terminal of said resistor connected to ground;

a second capacitor having a first terminal and a second terminal, the first terminal of said second capacitor connected to the first terminal of said first rectifier and the second terminal of said second capacitor connected to the second terminal of said second rectifier; and a fifth rectifier having a first terminal and a second terminal, the first terminal of said fifth rectifier connected to the second terminal of said second capacitor and the second terminal of said fifth rectifier connected to the output terminal of said circuit.

16. A boost converter circuit comprising:

a first inductive means for receiving forward current supplied to an input terminal of said circuit;

a first electronic switch coupled to said first inductive means, said first electronic switch having a parasitic intrinsic capacitance and being cyclically switched between a conducting state in which forward current flows from said first inductive means through said switch, and a non-conducting state in which forward current flows from said first inductive means to an output terminal of said circuit;

a first capacitive means coupled to said output terminal for providing an output voltage, said capacitive means being charged when said first electronic switch is in the non-conducting state;

a first rectifying means coupled between said first inductive means and said first capacitive means, said first rectifying means passing forward current to said first capacitive means when said first electronic switch is in the non-conducting state, and blocking the flow of reverse current from said first capacitive means when said switch is in the conducting state;

means for discharging the parasitic intrinsic capacitance of said first electronic switch comprising:

a second inductive means coupled between said first inductive means and said first rectifying means; and a second electronic switch coupled to said second inductive means, said second electronic switch being cyclically switched to a conducting state when said first electronic switch is in the non-conducting state for causing forward current to be diverted from said first rectifying means to said second inductive means, said parasitic capacitance being discharged by current flowing from said first electronic switch to said second inductive means;

a second capacitive means coupled to said second inductive means, said second capacitive means acting to limit the voltage across said first and second electronic switches when each of said electronic switches is turned off;

a second rectifying means coupled between said second inductive means and said second electronic switch;

a third rectifying means coupled between said second inductive means and second capacitive means; and a fourth rectifying means coupled between said first rectifying means and said second capacitive means.

\* \* \* \* \*

UNITED STATES PATENT AND TRADEMARK OFFICE
CERTIFICATE OF CORRECTION

PATENT NO. : 5,543,704  
DATED : Aug. 6, 1996  
INVENTOR(S) : Thorén

Page 1 of 2

It is certified that error appears in the above-indentified patent and that said Letters Patent is hereby corrected as shown below:

| | |
|---|---|
| Column 1, line 38 | Replace "IL104" With -- IL104 --. |
| Column 1, line 50 | Replace "IL104" With -- IL104 --. |
| Column 2, line 57 | Replace "ti me interval s" With --time intervals-- |
| Column 2, line 65 | Replace "decrease by" With --decreases,-- |
| Column 7, line 21 | Replace "mini real." With --minimal.-- |
| Column 8, line 10 | Replace "arid" With --and-- |
| Column 9, line 41 | Replace "means" (1st occur.) With --means,-- |

UNITED STATES PATENT AND TRADEMARK OFFICE
CERTIFICATE OF CORRECTION

| | | |
|---|---|---|
| PATENT NO. : | 5,543,704 | |
| DATED : | Aug. 6, 1996 | |
| INVENTOR(S) : | Thorén | |

It is certified that error appears in the above-indentified patent and that said Letters Patent is hereby corrected as shown below:

Column 10, line 10   Replace "voltages,"
                        With --voltage,--

Signed and Sealed this

Twenty-seventh Day of January, 1998

BRUCE LEHMAN

*Attest:*

*Attesting Officer*   *Commissioner of Patents and Trademarks*